US011302509B2

(12) United States Patent
Ikeda et al.

(10) Patent No.: US 11,302,509 B2
(45) Date of Patent: Apr. 12, 2022

(54) ELECTRON GUN AND ELECTRON BEAM DEVICE

(71) Applicant: JEOL Ltd., Tokyo (JP)

(72) Inventors: Akihiro Ikeda, Tokyo (JP); Norikazu Arima, Tokyo (JP)

(73) Assignee: JEOL Ltd., Tokyo (JP)

( * ) Notice: Subject to any disclaimer, the term of this patent is extended or adjusted under 35 U.S.C. 154(b) by 622 days.

(21) Appl. No.: 16/123,297

(22) Filed: Sep. 6, 2018

(65) Prior Publication Data

US 2019/0080878 A1 Mar. 14, 2019

(30) Foreign Application Priority Data

Sep. 7, 2017 (JP) .............................. JP2017-172063

(51) Int. Cl.
*H01J 37/063* (2006.01)
*H01J 3/02* (2006.01)
*G02B 5/08* (2006.01)

(52) U.S. Cl.
CPC .............. *H01J 37/063* (2013.01); *G02B 5/08* (2013.01); *H01J 3/027* (2013.01)

(58) Field of Classification Search
CPC .... H01J 37/073; H01J 37/26; H01J 2237/022; H01J 2237/0473; H01J 2237/04735; H01J 2237/057; H01J 2237/06341; H01J 2237/1035; H01J 2237/14; H01J 2237/182; H01J 37/05; H01J 37/06; H01J 37/065;
(Continued)

(56) References Cited

U.S. PATENT DOCUMENTS 4,878,866 A * 11/1989 Mori ...................... H01J 1/148
445/36
4,945,247 A * 7/1990 Kawasaki ............. H01J 37/073
250/423 F
(Continued)

FOREIGN PATENT DOCUMENTS

| JP | 3101040 A | 4/1991 |
| JP | 9161682 A | 6/1997 |
| JP | 10241480 A | 9/1998 |

OTHER PUBLICATIONS

English Translation JP 9161682 (Year: 1997).*
Office Action issued in JP2018166784 dated Nov. 2, 2021.

*Primary Examiner* — Tu B Hoang
*Assistant Examiner* — Vy T Nguyen
(74) *Attorney, Agent, or Firm* — The Webb Law Firm

(57) ABSTRACT

An electron gun includes an emitter, an electron gun electrode, and a short-circuiting mechanism for setting the emitter and the electron gun electrode at the same potential. The short-circuiting mechanism includes a first switch member provided with a first switch electrode that is connected to the emitter and a second switch electrode that is connected to the electron gun electrode, a second switch member provided with a third switch electrode, and a drive unit that operates at least one of the first switch member and the second switch member to switch between a state in which the first switch electrode and the second switch electrode are in contact with the third switch electrode and a state in which the first switch electrode and the second switch electrode are separated from the third switch electrode. The short-circuiting mechanism has the same potential as a predetermined voltage.

14 Claims, 11 Drawing Sheets

(58) Field of Classification Search
CPC ........ H01J 37/147; H01J 37/24; H01J 37/261; H01J 37/265; H01J 37/3178; H01J 3/021; H01J 9/39; H01J 9/505; H01J 5/06; Y02W 30/828; Y02W 30/82; H05H 5/02
See application file for complete search history.

(56) References Cited

U.S. PATENT DOCUMENTS

| | | | | |
|---|---|---|---|---|
| 7,598,471 | B2* | 10/2009 | Hamashima | F01N 3/2828 |
| | | | | 219/69.15 |
| 2007/0160932 | A1* | 7/2007 | Kojima | G11B 7/261 |
| | | | | 430/296 |
| 2011/0182161 | A1* | 7/2011 | Suzuki | B82Y 40/00 |
| | | | | 369/47.13 |
| 2013/0087703 | A1* | 4/2013 | Onishi | H01J 3/021 |
| | | | | 250/306 |
| 2014/0048727 | A1* | 2/2014 | Huntzinger | G21K 1/10 |
| | | | | 250/503.1 |
| 2017/0093087 | A1* | 3/2017 | Esmaeili | H01R 13/6205 |

* cited by examiner

ELECTRON GUN AND ELECTRON BEAM DEVICE

CROSS-REFERENCE TO RELATED APPLICATION

This application claims priority to Japanese Patent Application No. 2017-172063 filed Sep. 7, 2017, the disclosure of which is hereby incorporated in its entirety by reference.

BACKGROUND OF THE INVENTION

Field of the Invention

The present invention relates to an electron gun and an electron beam device.

Description of Related Art

To apply a high voltage with stability in an electron gun used in an electron microscope, discharge is generated intentionally by applying a higher voltage than that applied during normal use, thereby removing projections on an electrode surface in the interior of the electron gun. This process is known as conditioning.

Conditioning includes AC conditioning, which is performed by applying an AC voltage to the electrode, and DC conditioning, which is performed by applying a DC voltage.

In AC conditioning, an AC voltage is applied to the electrode, and therefore discharge is not generated constantly. Hence, conditioning can be performed comparatively safely. AC conditioning is implemented during the manufacturing process of the electron gun and cannot be performed by a user. During AC conditioning, two types of conditioning, namely insulator conditioning and electrode conditioning, are implemented, insulator conditioning being performed in a state where an emitter of the electron gun is not attached and electrode conditioning being performed in a state where the emitter is attached.

In the manufacturing process of the electron gun, DC conditioning is implemented after performing AC conditioning.

DC conditioning can be performed by the user. DC conditioning is performed when the electron gun has been out of use for a long time, when the electron gun is started up following baking, when an operation of the electron gun is unstable, and so on.

During DC conditioning, the emitter is attached, and therefore, to avoid damage to the emitter caused by discharge, electrodes in the vicinity of the emitter are short-circuited so that potential differences do not occur between the electrodes.

JP-A-9-161682, for example, discloses an operating member used to operate an electrode switch provided in the interior of an electron microscope from the outside of the electron microscope. In JP-A-9-161682, when conditioning is performed, the user operates the electrode switch using the operating member in order to short-circuit an emitter and an electron gun electrode having a different potential to the emitter.

However, when the electrode switch is provided in a high-voltage part in the interior of the electron microscope and the electrode switch in the interior of the electron microscope is operated using the operating member from the outside of the electron microscope, as in JP-A-9-161682, the user must access the high-voltage part, albeit via the operating member. This action is dangerous, and therefore, when the electrode switch is operated using the operating member, the high-voltage applied to the electron gun must be switched OFF. However, switching a high voltage ON and OFF in this manner takes several hours, leading to a large time loss.

SUMMARY OF THE INVENTION

The invention can provide an electron gun in which an emitter and an electron gun electrode can be short-circuited in a state where a high voltage has been applied, and an electron beam device including the electron gun.

According to a first aspect of the invention, there is provided an electron gun that accelerates electron at a predetermined voltage and discharges the accelerated electrons, the electron gun including:

an emitter;
an electron gun electrode; and
a short-circuiting mechanism for setting the emitter and the electron gun electrode at the same potential,
the short-circuiting mechanism including:
a first switch member provided with a first switch electrode that is connected to the emitter and a second switch electrode that is connected to the electron gun electrode;
a second switch member provided with a third switch electrode; and
a drive unit that operates at least one of the first switch member and the second switch member to switch between a state in which the first switch electrode and the second switch electrode are in contact with the third switch electrode and a state in which the first switch electrode and the second switch electrode are separated from the third switch electrode, the short-circuiting mechanism having the same potential as the predetermined voltage.

According to a second aspect of the invention, there is provided an electron gun including:

an emitter;
an electron gun electrode;
a short-circuiting mechanism for setting the emitter and the electron gun electrode at the same potential; and
a terminal plate provided with a terminal that is electrically connected to the emitter and a terminal that is electrically connected to the electron gun electrode,
the short-circuiting mechanism including:
a first switch member provided with a first switch electrode that is connected to the emitter and a second switch electrode that is connected to the electron gun electrode;
a second switch member provided with a third switch electrode; and
a drive unit that operates at least one of the first switch member and the second switch member to switch between a state in which the first switch electrode and the second switch electrode are in contact with the third switch electrode and a state in which the first switch electrode and the second switch electrode are separated from the third switch electrode,
the short-circuiting mechanism being located on the terminal plate.

According to a third aspect of the invention, there is provided an electron beam device including either of the electron guns described above.

Figure 1:
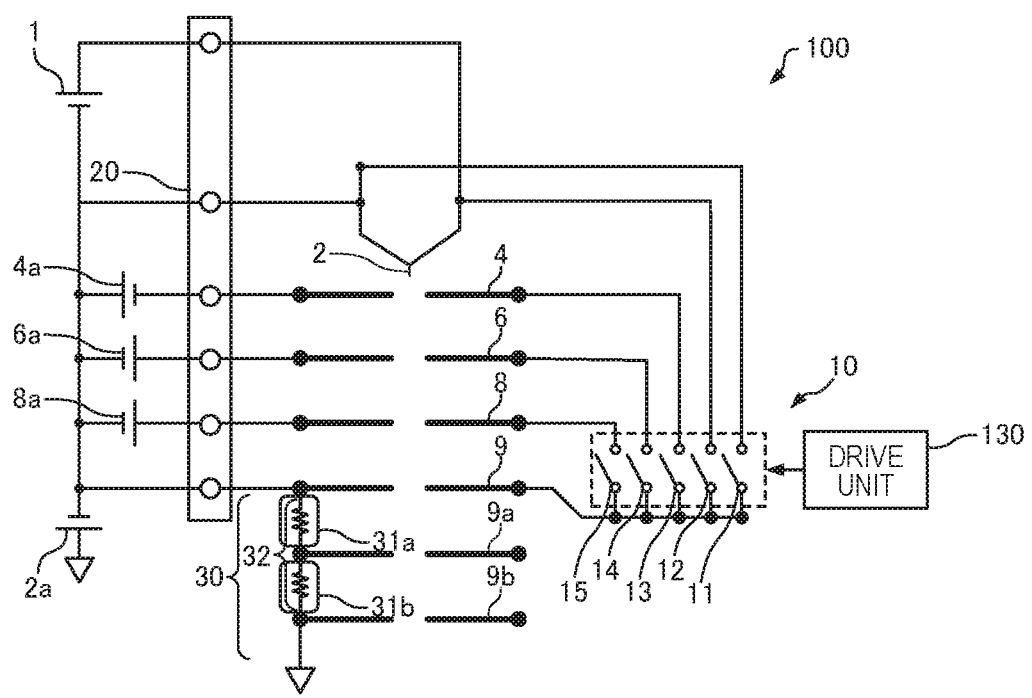
FIG. 1 is a diagram illustrating a configuration of an electron gun according to one embodiment of the invention.

DESCRIPTION OF THE INVENTION (1) According to one embodiment of the invention, there is provided an electron gun that accelerates electrons at a predetermined voltage and discharges the accelerated electrons, the electron gun including:
an emitter;
an electron gun electrode; and
a short-circuiting mechanism for setting the emitter and the electron gun electrode at the same potential,
the short-circuiting mechanism including:
a first switch member provided with a first switch electrode that is connected to the emitter and a second switch electrode that is connected to the electron gun electrode;
a second switch member provided with a third switch electrode; and
a drive unit that operates at least one of the first switch member and the second switch member to switch between a state in which the first switch electrode and the second switch electrode are in contact with the third switch electrode and a state in which the first switch electrode and the second switch electrode are separated from the third switch electrode,
the short-circuiting mechanism having the same potential as the predetermined voltage.

In this electron gun, the short-circuiting mechanism is set at the same potential as the predetermined voltage (a high voltage), and therefore the emitter and the electron gun electrode can be short-circuited in a state where the predetermined voltage has been applied to the electron gun.

(2) The electron gun described above may further include a terminal plate provided with a terminal that is electrically connected to the emitter and a terminal that is electrically connected to the electron gun electrode, and the short-circuiting mechanism may be located on the terminal plate.

With this electron gun, the short-circuiting mechanism can be provided with a simple configuration.

(3) According to one embodiment of the invention, there is provided an electron gun including:
an emitter;
an electron gun electrode;
a short-circuiting mechanism for setting the emitter and the electron gun electrode at the same potential; and
a terminal plate provided with a terminal that is electrically connected to the emitter and a terminal that is electrically connected to the electron gun electrode,
the short-circuiting mechanism including:
a first switch member provided with a first switch electrode that is connected to the emitter and a second switch electrode that is connected to the electron gun electrode;
a second switch member provided with a third switch electrode; and
a drive unit that operates at least one of the first switch member and the second switch member to switch between a state in which the first switch electrode and the second switch electrode are in contact with the third switch electrode and a state in which the first switch electrode and the second switch electrode are separated from the third switch electrode, and
the short-circuiting mechanism being located on the terminal plate.

In this electron gun, the short-circuiting mechanism is located on the terminal plate, and therefore the short-circuiting mechanism can be set at the same potential as the predetermined voltage (a high voltage). As a result, the emitter and the electron gun electrode can be short-circuited in a state where the predetermined voltage has been applied to the electron gun.

(4) In each of the above-described electron guns,
each of the electron guns may include a plurality of the electron gun electrodes, and
the first switch member may be provided with a plurality of the second switch electrodes.

With the electron guns, the emitter and the plurality of electron gun electrodes can be short-circuited by means of a simple configuration.

(5) In each of the above-described electron guns,
the drive unit may bring the first switch electrode and the second switch electrode into contact with the third switch electrode in response to an operation of a motor.

(6) In each of the above-described electron guns,
the drive unit may include a nut, a screw shaft that is screwed to the nut, and a motor that rotates the screw shaft, and
the motor may rotate the screw shaft to move the first switch member.

(7) In each of the above-described electron guns,
the nut may be inserted into a notch provided in the first switch member.

With the electron guns, the nut can be fixed so as not to rotate by inserting the nut into the notch.

(8) In each of the above-described electron guns,
a surface of the first switch member on which the first switch electrode and the second switch electrode are provided may be a convex surface, and
a surface of the second switch member on which the third switch electrode is provided may be a concave surface.

With the electron guns, the first switch electrode and the second switch electrode can be brought into contact with the third switch electrode more reliably.

(9) Each of the above-described electron guns may further include a detection unit that detects whether or not the first switch electrode and the second switch electrode are separated from the third switch electrode.

With the electrode guns, it is possible to determine whether or not the electron guns can be used.

(10) In each of the above-described electron guns,
the first switch member may be configured to rotate,
a mirror may be provided on the first switch member, and
the detection unit may include:
a light emitting element that emits light onto the mirror; and
a light receiving element that detects light reflected by the mirror.

With the electron guns, the detection unit for detecting the mode of the electron gun can be disposed outside an electron gun chamber.

(11) According to one embodiment of the invention, there is provided an electron beam device including either of the electron guns described above.

The electron beam device includes either of the electron guns described above, and therefore conditioning can be performed on the electron gun quickly.

Embodiments of the invention will be described in detail below with reference to the drawings. Note that the following embodiments do not unduly limit the scope of the invention as stated in the claims. Moreover, all of the elements described in the following embodiments should not necessarily be taken as essential requirements of the invention.

1. Electron Gun 1.1. Configuration of Electron Gun

Figure 2:
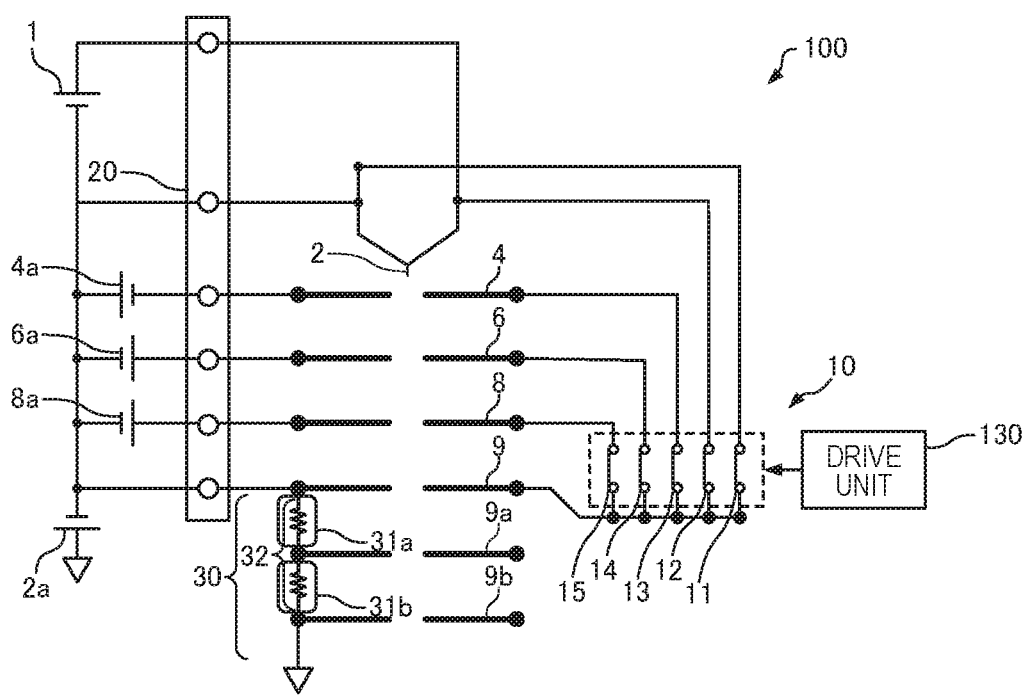
FIG. 2 is a diagram illustrating a configuration of an electron gun according to one embodiment of the invention.

First, an electron gun according to one embodiment of the invention will be described with reference to the drawings. FIGS. 1 and 2 are diagrams illustrating a configuration of an electron gun 100 according to one embodiment of the invention. Note that FIG. 1 illustrates the electron gun 100 in an operation mode, while FIG. 2 illustrates the electron gun 100 in a conditioning mode.

The electron gun 100 is a Schottky electron gun, for example. Note that there are no particular limitations on the type of electron gun, and a field-emission electron gun or the like may be used instead. As illustrated in FIG. 1, the electron gun 100 includes an emitter 2, a suppressor electrode 4, a first anode electrode 6, a second anode electrode 8, an accelerating electrode 9, a short-circuiting mechanism 10, a terminal plate 20, and an acceleration tube 30.

The emitter 2 is an electron discharge source, or in other words a cathode. In the emitter 2, electrons are discharged by a strong electric field created by the first anode electrode 6. The emitter 2 is heated by a current supplied from a heating power supply 1.

The suppressor electrode 4 is disposed between the emitter 2 and the first anode electrode 6. A negative potential is applied to the emitter 2 and the suppressor electrode 4 is used to focus the electrons discharged from the emitter 2.

The first anode electrode 6 is used to extract electrons from the emitter 2.

The second anode electrode 8 functions as an electrostatic lens with respect to the electrons discharged from the emitter 2.

The acceleration tube 30 includes accelerating electrodes 9, 9a, 9b provided in a plurality of stages, insulators 31a, 31b disposed between the accelerating electrodes 9, 9a, 9b, and a voltage divider 32. In the example in the figure, the accelerating electrodes 9, 9a, 9b are provided in three stages, but there are no particular limitations on the number of stages. An accelerating power supply 2a is connected to the acceleration tube 30. An accelerating voltage applied from the accelerating power supply 2a is divided by the voltage divider 32 and applied to each of the accelerating electrodes. The acceleration tube 30 accelerates the electrons discharged from the emitter 2 using the accelerating potential applied thereto.

A required voltage is supplied to the suppressor electrode 4 from a suppressor power supply 4a. A required voltage is supplied to the first anode electrode 6 from a first anode power supply 6a. A required voltage is supplied to the second anode electrode 8 from a second anode power supply 8a. The accelerating electrode 9 is maintained at the accelerating potential, and a high voltage that is negative relative to a ground potential is applied to the emitter 2 from the accelerating power supply 2a. The accelerating power supply 2a supplies an accelerating voltage (a voltage for accelerating the electrons discharged from the emitter 2) to the acceleration tube 30.

The short-circuiting mechanism 10 short-circuits all of the emitter 2, the suppressor electrode 4, the first anode electrode 6, the second anode electrode 8, and the accelerating electrode 9. For example, the short-circuiting mechanism 10 connects the emitter 2, the suppressor electrode 4, the first anode electrode 6, and the second anode electrode 8 to an accelerating potential. In the example in the figure, the short-circuiting mechanism 10 electrically connects the emitter 2, the suppressor electrode 4, the first anode electrode 6, and the second anode electrode 8 to the accelerating electrode 9, for example.

The suppressor electrode 4, the first anode electrode 6, the second anode electrode 8, and the accelerating electrode 9 serve as electron gun electrodes constituting the electron gun 100. In other words, the electron gun 100 includes a plurality of electron gun electrodes.

The short-circuiting mechanism 10 includes a plurality of switches (a switch 11, a switch 12, a switch 13, a switch 14, and a switch 15), and a drive unit 130 for switching the plurality of switches ON and OFF. In the example in the figure, the short-circuiting mechanism 10 includes five switches 11 to 15.

The switch 11 is provided between one electrode of the emitter 2 and the accelerating electrode 9 (the accelerating potential). The switch 11 switches the one electrode of the emitter 2 and the accelerating electrode 9 between an electrically connected state (switch ON) and an electrically disconnected state (switch OFF).

The switch 12 is provided between the other electrode of the emitter 2 and the accelerating electrode 9. The switch 12 switches the other electrode of the emitter 2 and the accelerating electrode 9 between an electrically connected state (switch ON) and an electrically disconnected state (switch OFF).

The switch 13 is provided between the suppressor electrode 4 and the accelerating electrode 9. The switch 13 switches the suppressor electrode 4 and the accelerating electrode 9 between an electrically connected state (switch ON) and an electrically disconnected state (switch OFF).

The switch 14 is provided between the first anode electrode 6 and the accelerating electrode 9. The switch 14 switches the first anode electrode 6 and the accelerating electrode 9 between an electrically connected state (switch ON) and an electrically disconnected state (switch OFF).

The switch 15 is provided between the second anode electrode 8 and the accelerating electrode 9. The switch 15 switches the second anode electrode 8 and the accelerating electrode 9 between an electrically connected state (switch ON) and an electrically disconnected state (switch OFF).

In the electron gun 100, the drive unit 130 can be used to switch between a state illustrated in FIG. 1, in which the five switches 11 to 15 are OFF (the operation mode), and a state illustrated in FIG. 2, in which the five switches 11 to 15 are ON (the conditioning mode).

The operation mode is used when the electron microscope is used normally by generating an electron beam from the electron gun 100. The conditioning mode is used when DC conditioning is performed. DC conditioning is an operation for ensuring that the electron gun 100 can be used with stability, in which discharge is generated intentionally by applying a higher voltage than the voltage applied during normal use (approximately −220 kV when the acceleration voltage is −200 kV, for example) to the acceleration tube 30 in order to remove projections on the surfaces of the insulators 31a, 31b of the acceleration tube 30 and the accelerating electrodes 9, 9a, 9b.

During DC conditioning, the electron gun 100 is set in the conditioning mode such that the emitter 2, the suppressor electrode 4, the first anode electrode 6, the second anode electrode 8, and the accelerating electrode 9 are connected. In so doing, potential differences can be prevented from occurring between the respective electrodes (the emitter 2, the suppressor electrode 4, the first anode electrode 6, the second anode electrode 8, and the accelerating electrode 9). As a result, damage to the emitter 2 caused by discharge can be avoided during DC conditioning.

The terminal plate 20 functions as a terminal for supplying power to the respective electrodes. The terminal plate 20 is provided with terminals that are electrically connected respectively to the emitter 2, the suppressor electrode 4, the first anode electrode 6, the second anode electrode 8, and the accelerating electrode 9. For example, the terminal plate 20 is provided with terminals for connecting wires that are connected respectively to the emitter 2, the suppressor electrode 4, the first anode electrode 6, the second anode electrode 8, and the accelerating electrode 9 to wires that are connected to the respective power supplies 1, 4a, 6a, 8a, 2a.

In the electron gun 100, the emitter 2, the suppressor electrode 4, the first anode electrode 6, the second anode electrode 8, the accelerating electrode 9, the short-circuiting mechanism 10, the terminal plate 20, and the acceleration tube 30 are provided in an electron gun chamber (not shown).

1.2. Configuration of Short-Circuiting Mechanism

Figure 3:
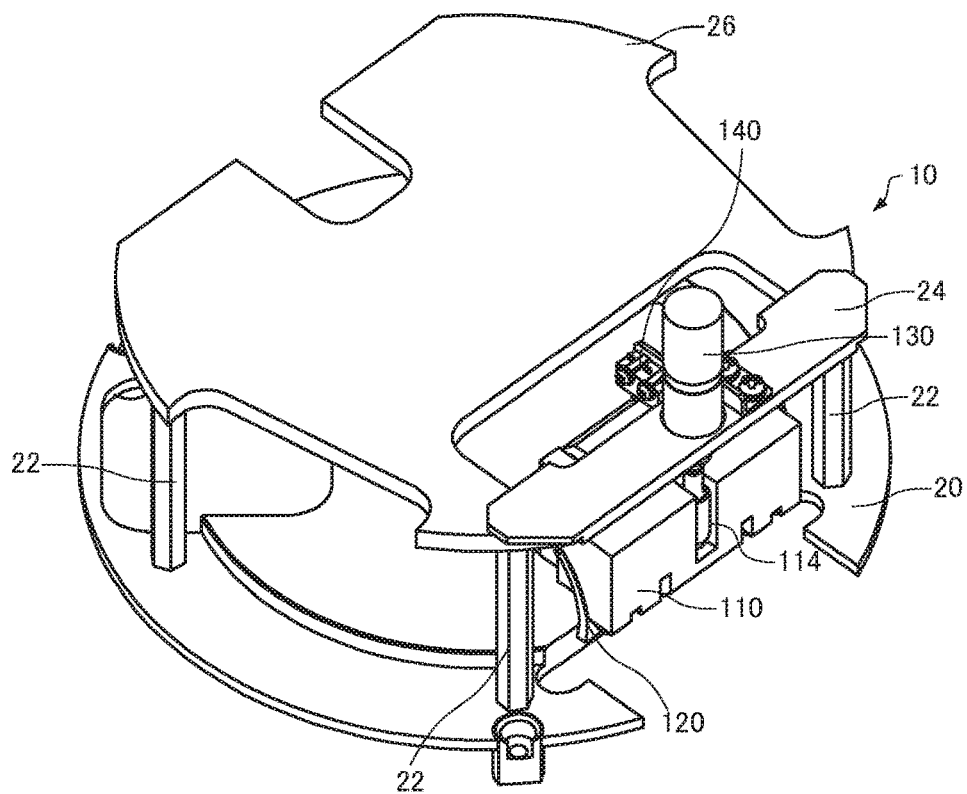
FIG. 3 is a schematic perspective view illustrating a short-circuiting mechanism of an electron gun according to one embodiment of the invention.
Figure 4:
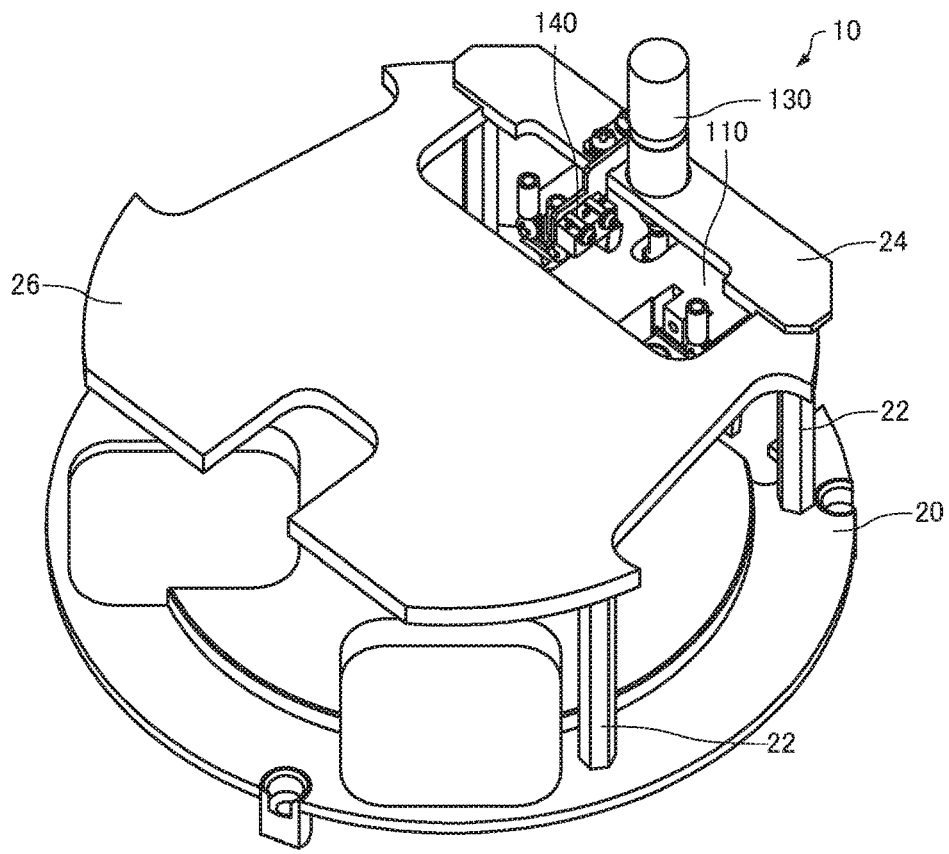
FIG. 4 is a schematic perspective view illustrating a short-circuiting mechanism of an electron gun according to one embodiment of the invention.

FIGS. 3 and 4 are schematic perspective views illustrating the short-circuiting mechanism 10 of the electron gun 100. FIGS. 3 and 4 illustrate the short-circuiting mechanism 10 from different directions.

As illustrated in FIGS. 3 and 4, the short-circuiting mechanism 10 is configured to include a first switch member 110, a second switch member 120, a drive unit 130, and a detection unit 140.

The short-circuiting mechanism 10 is provided on the terminal plate 20.

The second switch member 120 is disposed on the terminal plate 20. The first switch member 110 is supported rotatably by a rotary shaft provided on the second switch member 120. The drive unit 130 is supported by a plate 24 that is supported above the terminal plate 20 by a support member 22. In other words, the drive unit 130 is provided on the terminal plate 20 via the support member 22 and the plate 24. The detection unit 140 is provided on the plate 24.

An insulating plate 26 supported by the support member 22 is provided above the terminal plate 20.

The short-circuiting mechanism 10 and the terminal plate 20 are disposed in a high-voltage part (a high-voltage space) inside the electron gun chamber and set at the same potential (or a substantially the same potential) as the high voltage (a negative high voltage relative to the ground potential) supplied from the accelerating power supply 2a. For example, when the accelerating voltage is −200 kV, the short-circuiting mechanism 10 and the terminal plate 20 are set at −200 kV.

Figure 5:
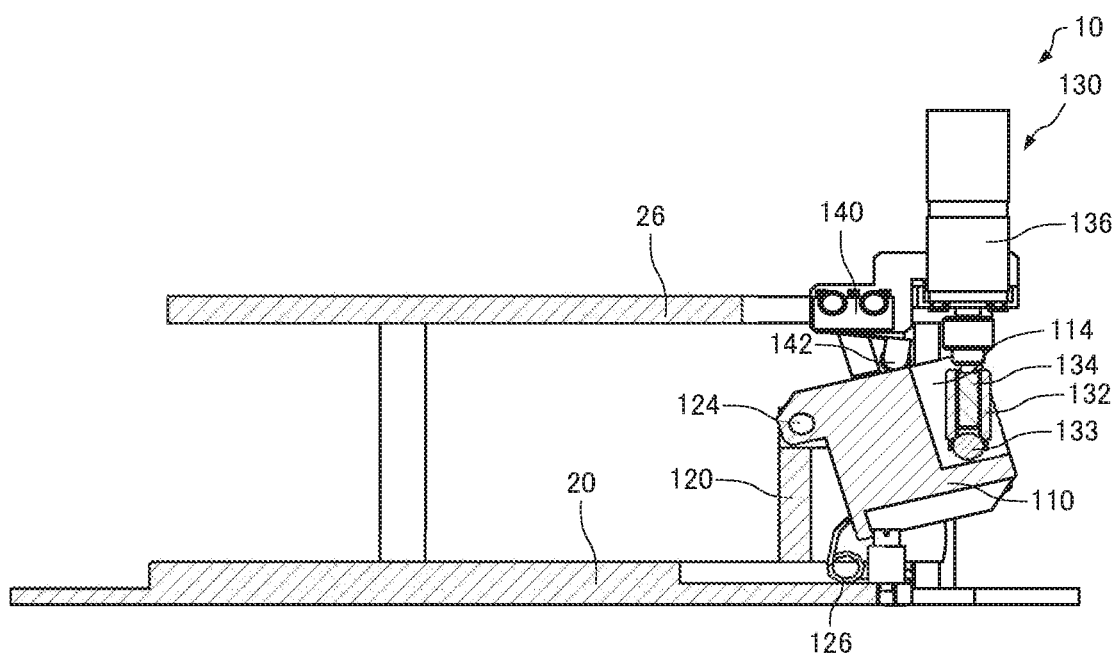
FIG. 5 is a schematic sectional view illustrating a short-circuiting mechanism of an electron gun according to one embodiment of the invention.
Figure 6:
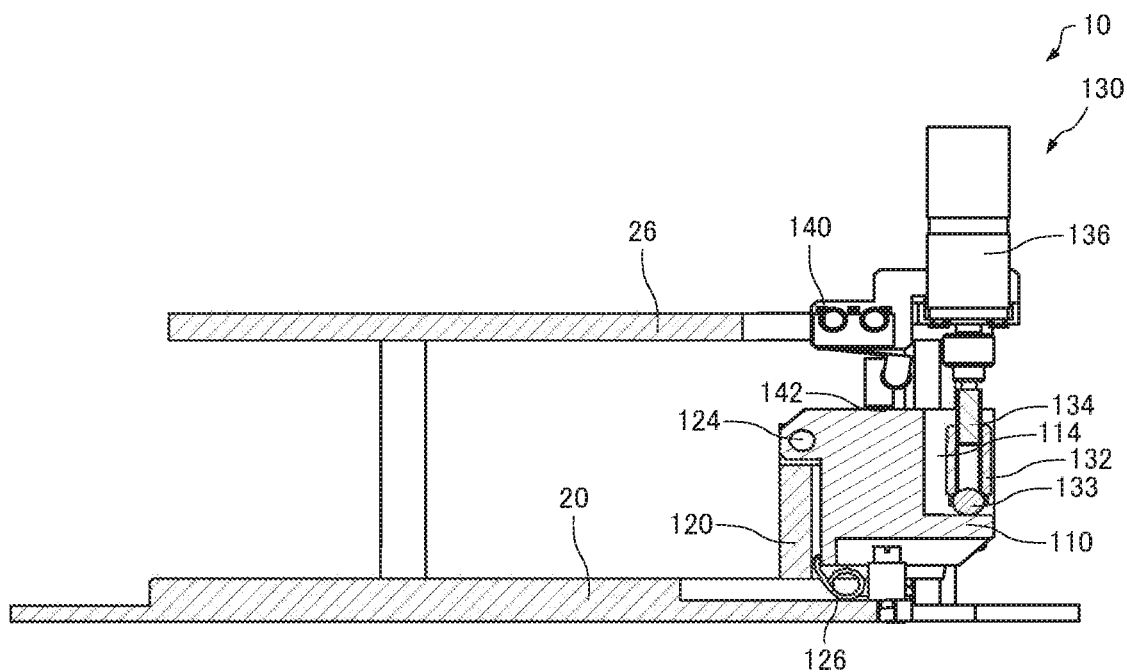
FIG. 6 is a schematic sectional view illustrating a short-circuiting mechanism of an electron gun according to one embodiment of the invention.
Figure 7:
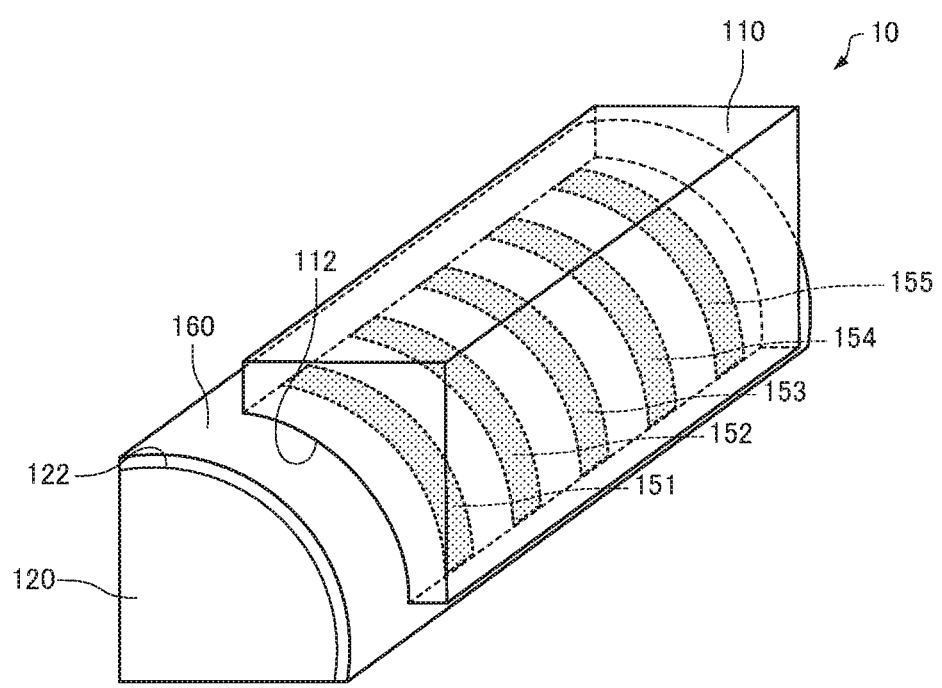
FIG. 7 is a schematic perspective view illustrating a first switch member and a second switch member.
Figure 8:
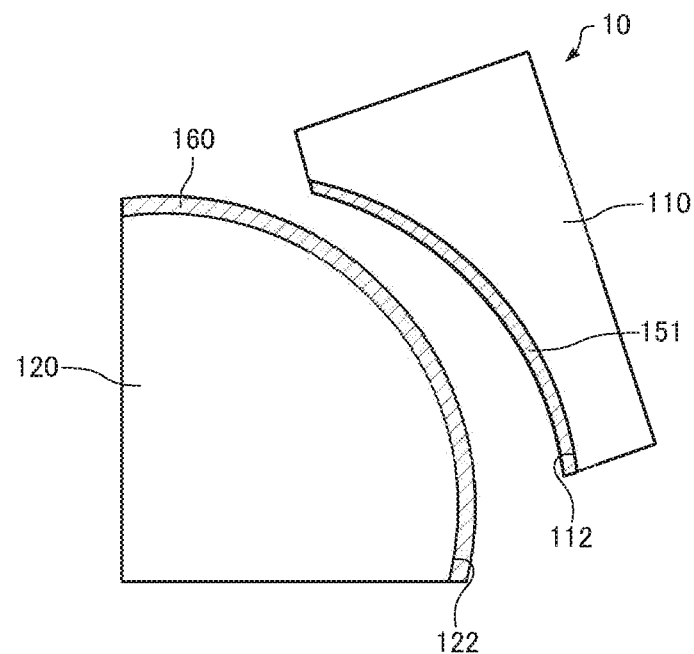
FIG. 8 is a schematic sectional view illustrating a first switch member and a second switch member.
Figure 9:
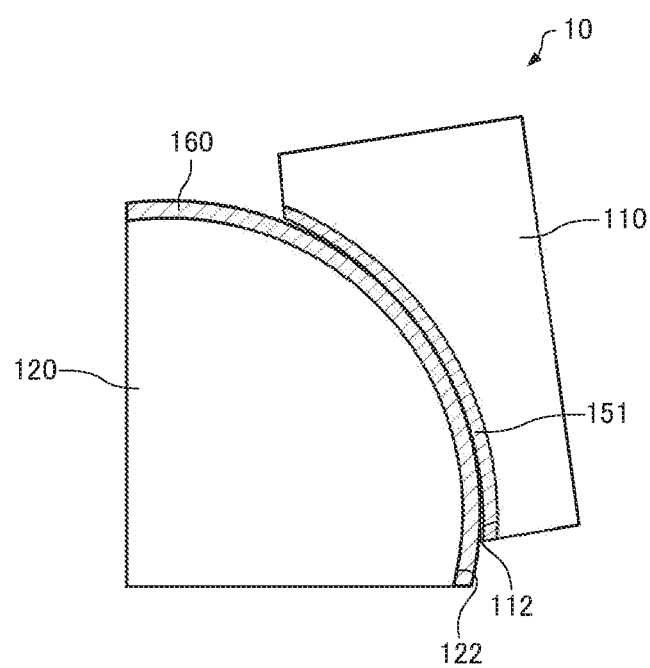
FIG. 9 is a schematic sectional view illustrating a first switch member and a second switch member.

FIGS. 5 and 6 are schematic sectional views illustrating the short-circuiting mechanism 10 of the electron gun 100. FIG. 7 is a schematic perspective view illustrating the first switch member 110 and the second switch member 120. FIGS. 8 and 9 are schematic sectional views illustrating the first switch member 110 and the second switch member 120.

Note that FIGS. 5 and 8 illustrate the operation mode of the electron gun 100, while FIGS. 6 and 9 illustrate the conditioning mode of the electron gun 100. Further, for convenience, FIGS. 7 to 9 illustrate the short-circuiting mechanism 10 in a simplified form.

The first switch member 110 is constituted by a member having an insulating property. A switch electrode 151 (a first switch electrode), a switch electrode 152 (the first switch electrode), a switch electrode 153 (a second switch electrode), a switch electrode 154 (the second switch electrode), and a switch electrode 155 (the second switch electrode) are provided on a first surface 112 of the first switch member 110. The first surface 112 of the first switch member 110 is a concave surface formed by cutting out a part of a cylindrical surface about a central axis of the cylindrical surface.

The switch electrode 151 is electrically connected to the one electrode of the emitter 2. The switch electrode 152 is electrically connected to the other electrode of the emitter 2. The switch electrode 153 is electrically connected to the suppressor electrode 4. The switch electrode 154 is electrically connected to the first anode electrode 6. The switch electrode 155 is electrically connected to the second anode electrode 8.

The second switch member 120 is constituted by a member having an insulating property, for example. A switch electrode 160 (a third switch electrode) is provided on a second surface 122 of the second switch member 120. The second surface 122 of the second switch member 120 is a convex surface formed by cutting out a part of a cylindrical surface about the central axis of the cylindrical surface. The second surface 122 of the second switch member 120 is formed to extend along the first surface 112 of the first switch member 110 when in contact with the first surface 112.

The switch electrode 160 is connected to the accelerating potential. For example, the switch electrode 160 is electrically connected to the accelerating electrode 9. The switch electrode 160 is disposed so as to face the switch electrodes 151 to 155.

The switch electrode 151 and the switch electrode 160 together constitute the switch 11 (see FIGS. 1 and 2). The switch electrode 152 and the switch electrode 160 together constitute the switch 12. The switch electrode 153 and the switch electrode 160 together constitute the switch 13. The switch electrode 154 and the switch electrode 160 together constitute the switch 14. The switch electrode 155 and the switch electrode 160 together constitute the switch 15.

Note that the second switch member 120 may be constituted by a member having a conductive property, and the surface of the second switch member 120 may be used as the switch electrode 160. In this case, the second switch member 120 is disposed on the terminal plate 20 via an insulating member.

The first switch member 110 is supported by a rotary shaft 124 provided on the second switch member 120. The first switch member 110 rotates about the rotary shaft 124 in response to an operation of the drive unit 130. Thus, it is possible to switch between the operation mode illustrated in FIGS. 5 and 8 and the conditioning mode illustrated in FIGS. 6 and 9.

In the operation mode, as illustrated in FIGS. 5 and 8, the switch electrodes 151 to 155 are separated from (not in contact with) the switch electrode 160. In the conditioning mode, as illustrated in FIGS. 6 and 9, the switch electrodes 151 to 155 are in contact with the switch electrode 160.

The drive unit 130 is configured to include a nut 132, a screw shaft 134, and a motor 136.

A notch 114 is provided in the first switch member 110, and the nut 132 is inserted into the notch 114. The nut 132 is fixed so as not to rotate. By inserting the nut 132 into the notch 114, an outer peripheral portion of the nut 132 is constrained by the inner surface of the notch 114, with the result that the nut 132 is fixed so as not to rotate.

A ball 133 is fixed to a tip end of the nut 132. The ball 133 serves as a part that contacts the first switch member 110. The ball 133 contacts a bottom surface of the notch 114. By providing the ball 133 on the tip end of the nut 132, force can be exerted on the first switch member 110 with stability even when the first switch member 110 rotates.

The screw shaft 134 is screwed to the nut 132. The screw shaft 134 is rotated by the motor 136. The nut 132 is fixed so as not to rotate, and therefore, when the screw shaft 134 rotates, the length of a part of the screw shaft 134 that is exposed from the nut 132 varies.

A spring 126 that exerts counter-clockwise rotational force on the first switch member 110 is provided on the terminal plate 20. When the first surface 112 of the first switch member 110 approaches the second surface 122 of the second switch member 120, counter-clockwise rotational force is exerted on the first switch member 110 by the spring 126.

When switching from the operation mode illustrated in FIG. 5 to the conditioning mode illustrated in FIG. 6, the screw shaft 134 is rotated in a loosening direction by the motor 136 such that the length of the part of the screw shaft 134 that is exposed from the nut 132 increases. Accordingly, the first switch member 110 is pushed downward so as to rotate clockwise. As a result, the switch electrodes 151 to 155 come into contact with the switch electrode 160, thereby establishing the conditioning mode.

When switching from the conditioning mode illustrated in FIG. 6 to the operation mode illustrated in FIG. 5, the screw shaft 134 is rotated in a screw-in direction by the motor 136 such that the length of the part of the screw shaft 134 that is exposed from the nut 132 decreases. Accordingly, the first switch member 110 is rotated counter-clockwise by the force of the spring 126. As a result, the switch electrodes 151 to 155 separate from the switch electrode 160, thereby establishing the operation mode.

The detection unit 140 detects the current mode of the electron gun 100. For example, the detection unit 140 detects whether or not the switch electrodes 151 to 155 are separated from the switch electrode 160. In other words, the detection unit 140 detects whether or not the operation mode is established.

The detection unit 140 is a limit switch, for example. The detection unit 140 includes a connector 142. When the first switch member 110 is in contact with the connector 142, for example, the detection unit 140 outputs a detection signal indicating that the operation mode is established. Further, when the first switch member 110 is not in contact with the connector 142, for example, the detection unit 140 outputs a detection signal indicating that the conditioning mode is established.

Although not shown in the drawings, a further detection unit for detecting whether or not the switch electrodes 151 to 155 are in contact with the switch electrode 160 may be provided. In this case, the drive unit 130 may be controlled by the two detection units.

The electron gun 100 includes the following features, for example.

In the electron gun 100, the short-circuiting mechanism 10 has the same potential as the high voltage for accelerating the electrons. With the electron gun 100, therefore, the respective electrodes of the electron gun 100 can be short-circuited in a state where a high voltage has been applied to the electron gun 100.

Further, in the electron gun 100, the short-circuiting mechanism 10 is provided on the terminal plate 20. The terminals that are electrically connected to the respective electrodes of the electron gun 100 are provided on the terminal plate 20, and therefore the short-circuiting mechanism 10 can be provided with a simple configuration by shortening the wiring length of wiring (not shown) for connecting the short-circuiting mechanism 10 to the respective electrodes and so on.

In the electron gun 100, the plurality of switch electrodes (the switch electrodes 151 to 155) are provided on the first switch member 110. With the electron gun 100, therefore, the number of components can be reduced in comparison with a case where, for example, the first switch member 110 is provided for each electrode of the electron gun 100, and as a result, the respective electrodes of the electron gun 100 can be short-circuited by means of a simple configuration.

In the electron gun 100, the first surface 112 on which the switch electrodes 151 to 155 of the first switch member 110 are provided is a convex surface, and the second surface 122 on which the switch electrode 160 of the second switch member 120 is provided is a concave surface. With the electron gun 100, therefore, the switch electrodes 151 to 155 can be brought into contact with the switch electrode 160 more reliably than in a case where the first surface 112 of the first switch member 110 and the second surface 122 of the second switch member 12 are flat surfaces.

In the electron gun 100, the detection unit 140 is provided to detect whether or not the switch electrodes 151 to 155 are separated from the switch electrode 160. With the electron gun 100, therefore, it is possible to determine whether or not the electron gun 100 is usable.

1.3. Modification Examples of Electron Gun

The invention is not limited to the embodiments described above, and various modifications are possible within the scope of the invention.

(1) First Modification Example

Figure 10:
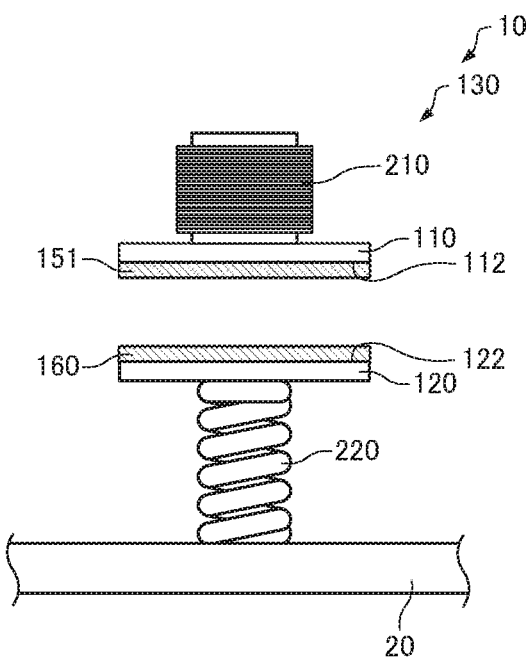
FIG. 10 schematically illustrates a short-circuiting mechanism of an electron gun according to a first modification example.
Figure 11:
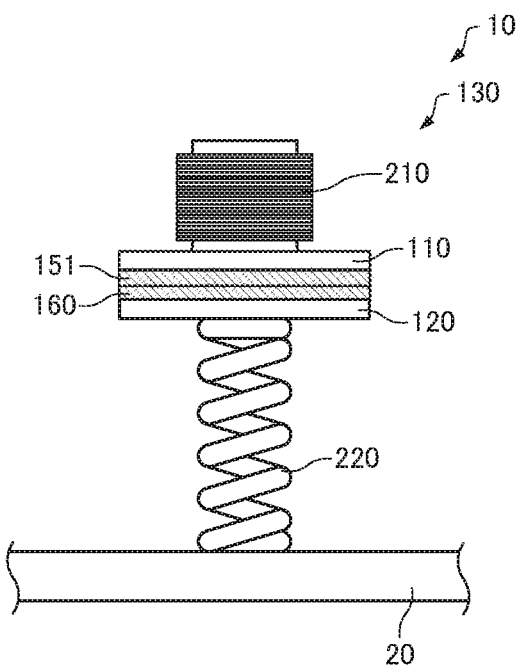
FIG. 11 schematically illustrates the short-circuiting mechanism of the electron gun according to the first modification example.

FIGS. 10 and 11 schematically illustrate the short-circuiting mechanism 10 according to a first modification example. Note that FIG. 10 illustrates the operation mode of the electron gun and FIG. 11 illustrates the conditioning mode of the electron gun. In the electron gun according to this modification example, components having similar functions to the components of the electron gun 100 described above are denoted by the same reference numerals, and further description thereof is omitted.

In the electron gun 100 described above, as illustrated in FIGS. 5 and 6, the drive unit 130 switches between the conditioning mode and the operation mode by rotating the screw shaft 134 screwed into the nut 132 using the motor 136, thereby moving the first switch member 110.

In this modification example, on the other hand, the drive unit 130 switches between the conditioning mode and the operation mode by moving the second switch member 120 using an electromagnet 210.

As illustrated in FIGS. 10 and 11, the drive unit 130 is configured to include the electromagnet 210 and a spring 220.

The electromagnet 210 is fixed to the first switch member 110. The electromagnet 210 is formed by winding a coil around a core made of a magnetic material, and generates magnetic force when a current flows through the coil.

The spring 220 connects the terminal plate 20 to the second switch member 120.

In this modification example, the first switch member 110 and the second switch member 120 are flat plate-shaped. The first surface 112 of the first switch member 110 and the second surface 122 of the second switch member 120 are flat surfaces. The second switch member 120 is constituted by a ferromagnetic material formed at least partially from iron or the like so that the magnetic force generated by the electromagnet 210 acts thereon.

The first switch member 110 is disposed on top of the second switch member 120. The first switch member 110 and the second switch member 120 are disposed opposite each other in a vertical direction.

When switching from the operation mode illustrated in FIG. 10 to the conditioning mode illustrated in FIG. 11, magnetic force is generated by supplying a current to the coil of the electromagnet 210, thereby attracting the second switch member 120 so that the second switch member 120 moves upward. Accordingly, the switch electrode 151 (as well as the switch electrodes 152, 153, 154, 155, not shown in the figure) provided on the first switch member 110 comes into contact with the switch electrode 160 provided on the second switch member 120, and as a result, the conditioning mode is established.

When switching from the conditioning mode illustrated in FIG. 11 to the operation mode illustrated in FIG. 10, the current supply to the coil is stopped. Accordingly, the second switch member 120 moves downward such that the switch electrode 151 (as well as the switch electrodes 152, 153, 154, 155, not shown in the figure) provided on the second switch member 120 separates from the switch electrode 160 provided on the second switch member 120, and as a result, the operation mode is established.

According to this modification example, similar actions and effects to those of the electron gun 100 described above can be realized.

(2) Second Modification Example

Figure 12:
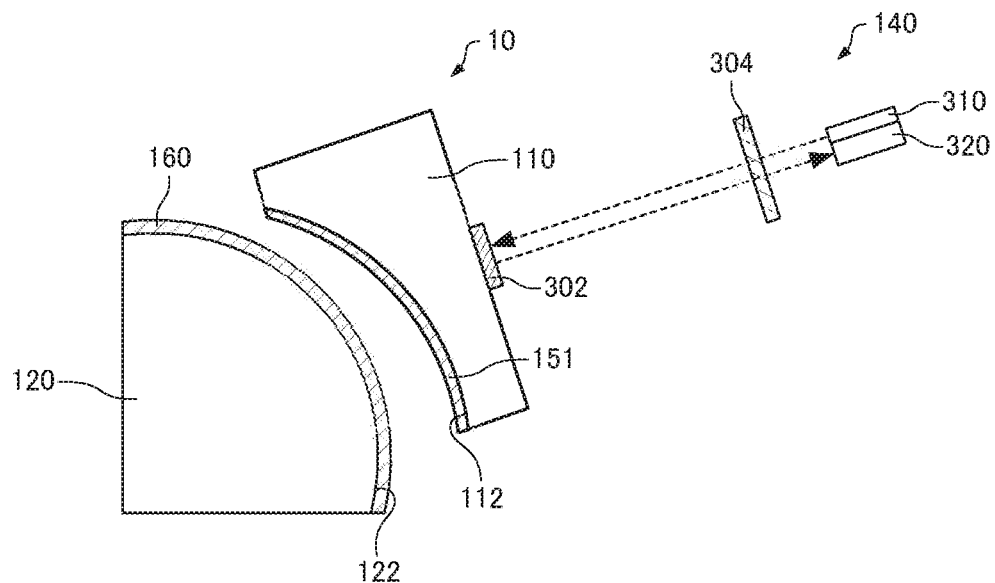
FIG. 12 schematically illustrates a detection unit of an electron gun according to a second modification example.
Figure 13:
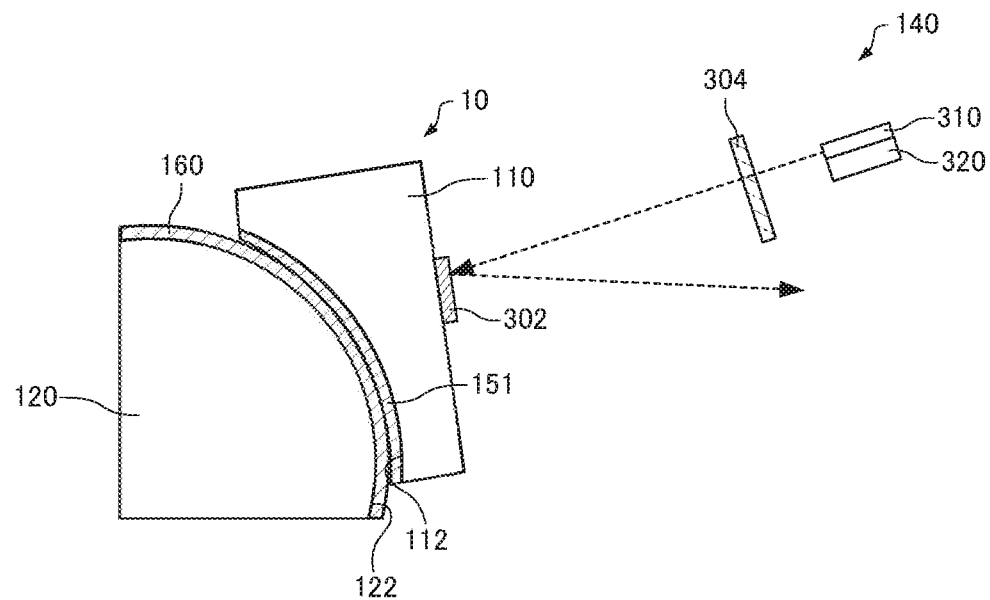
FIG. 13 schematically illustrates the detection unit of the electron gun according to the second modification example.

FIGS. 12 and 13 schematically illustrate the detection unit 140 of the electron gun according to a second modification example. Note that FIG. 12 illustrates the operation mode of the electron gun and FIG. 13 illustrates the conditioning mode of the electron gun. In the electron gun according to this modification example, components having similar functions to the components of the electron gun 100 described above are denoted by the same reference numerals, and further description thereof is omitted.

In the electron gun 100 described above, the detection unit 140 is constituted by a limit switch. In this modification example, on the other hand, the detection unit 140 is configured to include a light emitting element 310 and a light receiving element (a light detecting element) 320.

The light emitting element 310 emits light toward a mirror 302 provided on the first switch member 110. The light emitting element 310 is a laser, a light emitting diode (LED), or the like, for example.

The light receiving element 320 receives light reflected by the mirror 302. The light receiving element 320 converts incident light into an electric signal.

The mirror 302 is provided on a side face of the first switch member 110. There are no particular limitations on the mirror 302, as long as the mirror 302 is capable of reflecting the light emitted from the light emitting element 310, and a metal mirror, for example, may be used.

The light emitting element 310 and the light receiving element 320 are disposed outside the electron gun chamber (not shown). The light emitted from the light emitting element 310 is emitted onto the mirror 302 through a window 304 provided in the electron gun chamber. Further, the light emitted from the light emitting element 310 and reflected by the mirror 302 enters the light receiving element 320 through the window 304. The window 304 is constituted by a member that is transparent to the light emitted from the light emitting element 310.

As illustrated in FIGS. 12 and 13, the light emitting element 310 and the light receiving element 320 are configured such that when the electron gun 100 is in the operation mode, the light emitted from the light emitting element 310 and reflected by the mirror 302 enters the light receiving element 320, and when the electron gun 100 is in the conditioning mode, the light emitted from the light emitting element 310 and reflected by the mirror 302 does not enter the light receiving element 320.

Hence, in this modification example, the current mode of the electron gun 100 can be determined on the basis of an output signal from the light receiving element 320.

According to this modification example, similar actions and effects to those of the electron gun 100 described above can be realized.

Furthermore, according to this modification example, the detection unit 140 can be disposed outside the electron gun chamber.

Figure 14:
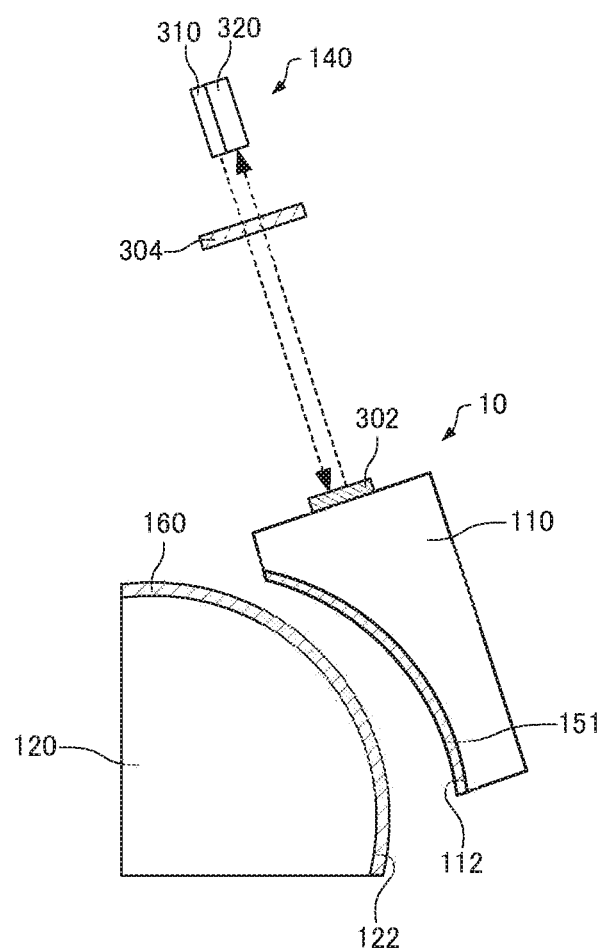
FIG. 14 schematically illustrates the detection unit of the electron gun according to the second modification example.

Note that in the above description, as illustrated in FIGS. 12 and 13, a case in which the mirror 302 is provided on the side face of the first switch member 110 was described, but there are no particular limitations on the location of the mirror 302, and as illustrated in FIG. 14, the mirror 302 may be provided on an upper face of the first switch member 110.

Further, in the above description, the light reflected by the mirror 302 enters the light receiving element 320 when the electron gun 100 is in the operation mode and does not enter the light receiving element 320 when the electron gun 100 is in the conditioning mode, but the opposite configuration may be employed. In other words, a configuration in which the light reflected by the mirror 302 does not enter the light receiving element 320 when the electron gun 100 is in the operation mode but enters the light receiving element 320 when the electron gun 100 is in the conditioning mode may be employed.

(3) Third Modification Example

In the electron gun 100 described above, as illustrated in FIGS. 5 and 6, the drive unit 130 switches the mode by moving the first switch member 110. Instead, however, although not shown in the drawings, the drive unit 130 may switch the mode by moving the second switch member 120. Further, although not shown in the drawings, the drive unit 130 may switch the mode by moving both the first switch member 110 and the second switch member 120.

(4) Fourth Modification Example

In the electron gun 100 described above, as illustrated in FIG. 7, the plurality of switch electrodes 151 to 155 are provided on the single first switch member 110 so that the five switches 11 to 15 are formed by the single group of switch members 110, 120. Instead, however, although not shown in the drawings, a single switch electrode may be provided on the single first switch member 110 so that the five switches 11 to 15 are formed by five groups of switch members 110, 120.

(5) Fifth Modification Example

In the electron gun 100 described above, the drive unit 130 switches the mode by moving the first switch member 110. Instead, however, although not shown in the drawings, the mode may be switched by operating an operating member manually in order to move the first switch member 110. In other words, in this modification example, the electron gun may include two mode switching means (switching using the drive unit 130 and manual switching). The operating member is a rod capable of accessing the first switch member 110, for example. A user can switch the mode by operating the rod from the outside of the electron gun chamber so as to rotate the first switch member 110.

2. Electron Microscope

Figure 15:
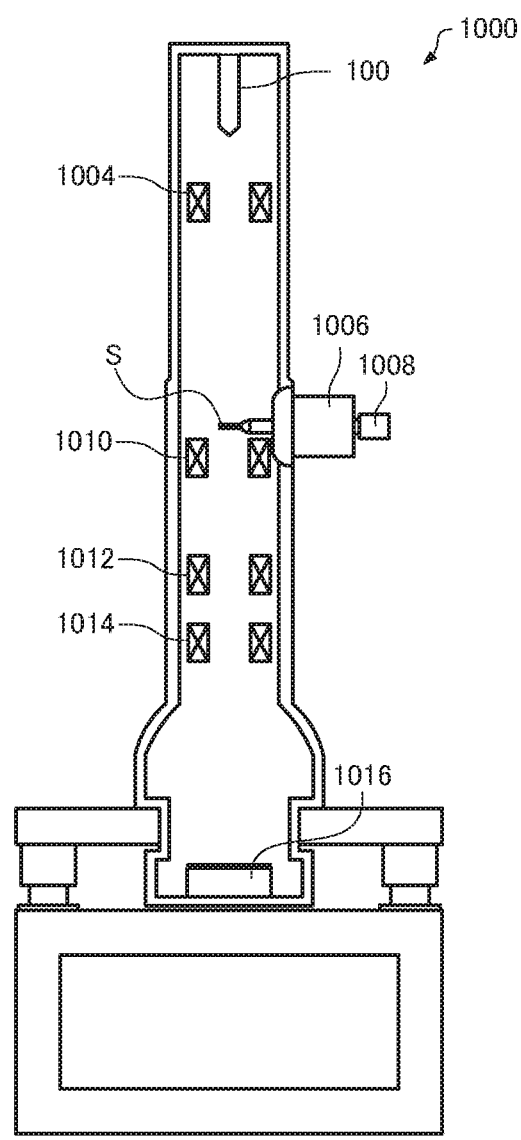
FIG. 15 schematically illustrates an electron microscope according to one embodiment of the invention.

Next, an electron microscope according to one embodiment of the invention will be described with reference to the drawings. FIG. 15 schematically illustrates an electron microscope 1000 according to one embodiment of the invention.

The electron microscope 1000 is configured to include an electron gun according to one embodiment of the invention. Here, an example in which the electron microscope 1000 includes the electron gun 100 as an electron gun according to one embodiment of the invention will be described. Note that for convenience, FIG. 15 illustrates the electron gun 100 in simplified form.

As illustrated in FIG. 15, the electron microscope 1000 is configured to include the electron gun 100, an illumination lens 1004, a specimen stage 1006, a specimen holder 1008, an objective lens 1010, an intermediate lens 1012, a projection lens 1014, and an imaging device 1016. The electron microscope 1000 is a transmission electron microscope (TEM) that forms an image using an electron beam passing through a specimen S.

The electron gun 100 discharges the electron beam.

The illumination lens 1004 irradiates the specimen S by focusing the electron beam discharged from the electron gun 100. Although not shown in the figure, the illumination lens 1004 may be constituted by a plurality of electron lenses.

The specimen stage 1006 holds the specimen S. In the example illustrated in the figure, the specimen stage 1006 holds the specimen S via the specimen holder 1008. The specimen S can be positioned using the specimen stage 1006. The specimen stage 1006 is a goniometer stage capable of tilting the specimen S, for example.

The objective lens 1010 is an initial stage lens for forming a transmission electron microscope image using the electron beam passing through the specimen S.

The intermediate lens 1012 and the projection lens 1014 enlarge the image formed by the objective lens 1010 so as to form an image on the imaging device 1016. The objective lens 1010, the intermediate lens 1012, and the projection lens 1014 together constitute an imaging system of the electron microscope 1000.

The imaging device 1016 photographs the transmission electron microscope image formed by the imaging system. The imaging device 1016 is a digital camera such as a CCD camera or a CMOS camera, for example.

In the electron microscope 1000, the electron beam discharged from the electron gun 100 is focused and irradiated onto the specimen S by the illumination lens 1004. The electron beam irradiated onto the specimen S is transmitted through the specimen S and formed into an image by the objective lens 1010. The transmission electron microscope image formed by the objective lens 1010 is further enlarged by the intermediate lens 1012 and the projection lens 1014 and then photographed by the imaging device 1016.

In the electron microscope 1000, DC conditioning can be performed on the electron gun 100. More specifically, when the electron gun 100 is switched to the conditioning mode, a higher voltage than the voltage applied during normal use is applied to the acceleration tube 30. In so doing, DC conditioning is performed.

Figure 16:
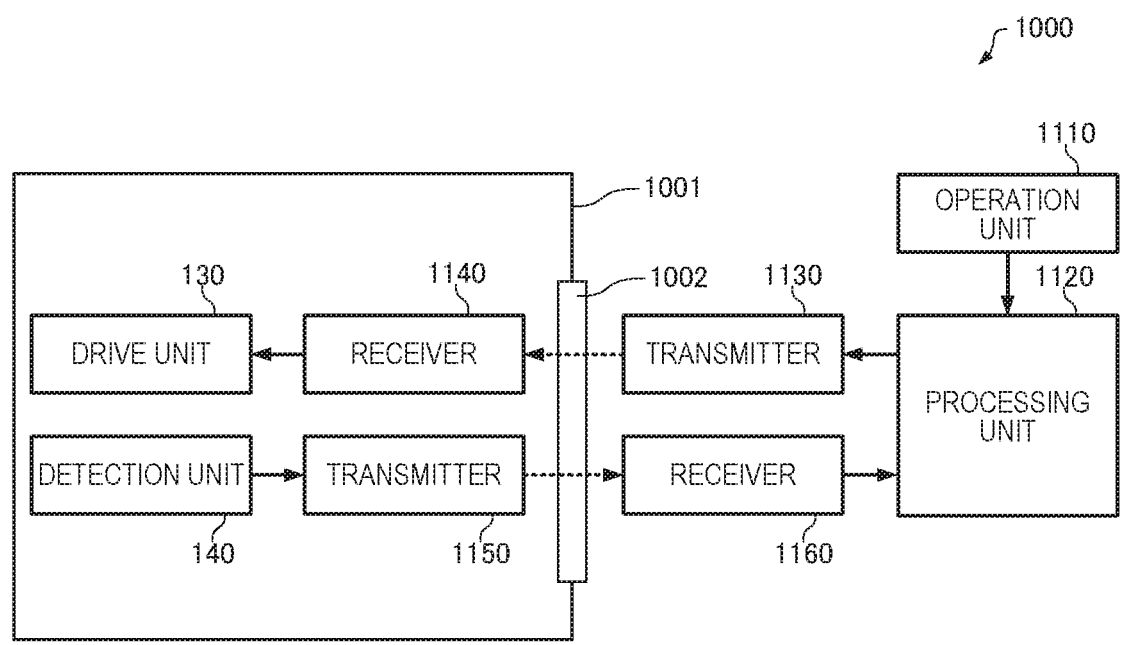
FIG. 16 is a functional block diagram of an electron microscope according to one embodiment of the invention.

FIG. 16 is a functional block diagram of the electron microscope 1000.

As illustrated in FIG. 16, the electron microscope 1000 is configured to include an operation unit 1110, a processing unit 1120, a transmitter 1130, a receiver 1140, a transmitter 1150, and a receiver 1160.

The operation unit 1110 executes processing for obtaining an operation signal corresponding to an operation performed by the user and transmitting the obtained operation signal to the processing unit 1120. The functions of the operation unit 1110 can be realized by a button, a key, a touch panel display, or the like, for example.

The processing unit 1120 executes processing for generating a control signal on the basis of the operation signal from the operation unit 1110, processing for determining the current mode of the electron gun on the basis of the detection signal from the detection unit 140, and so on. The functions of the processing unit 1120 can be realized by executing a program using various types of processors (a CPU, a DSP, or the like). Note that at least some of the functions of the processing unit 1120 may be realized by a dedicated circuit such as an ASIC (a gate array or the like).

The transmitter 1130 converts the control signal generated by the processing unit 1120 into an optical signal and transmits the generated optical signal to the receiver 1140. The transmitter 1130 is disposed outside an electron gun chamber 1001. The transmitter 1130 transmits the optical signal to the receiver 1140 through a window 1002 provided in the electron gun chamber 1001.

The receiver 1140 receives the optical signal from the transmitter 1130 and converts the received optical signal into an electric signal (a control signal). The receiver 1140 transmits the resulting electric signal (the control signal) to the drive unit 130 (the motor 136) in order to operate the drive unit 130. The receiver 1140 is disposed inside the electron gun chamber 1001.

The transmitter 1150 receives the detection signal from the detection unit 140, converts the received detection signal into an optical signal, and transmits the optical signal to the receiver 1160. The transmitter 1150 is disposed inside the electron gun chamber 1001. The transmitter 1150 transmits the optical signal to the receiver 1160 through the window 1002 provided in the electron gun chamber 1001.

The receiver 1160 receives the optical signal from the transmitter 1150 and converts the received optical signal into an electric signal (a detection signal). The receiver 1160 transmits the resulting electric signal (the detection signal) to the processing unit 1120. The processing unit 1120 executes processing for determining the mode of the electron gun 100 on the basis of the detection signal.

Note that in the above description, a case in which communication between the inside and outside of the electron gun chamber 1001 is executed using optical signals that pass through the window 1002 was described, but the parts that communicate using optical signals may be replaced with optical fiber or the like.

A method of implementing DC conditioning on the electron gun 100 of the electron microscope 1000 will now be described.

First, when the user operates the operation unit 1110 so as to issue an instruction to switch to the conditioning mode, the processing unit 1120 generates a control signal on the basis of the operation signal. The transmitter 1130 converts the control signal into an optical signal and transmits the optical signal to the receiver 1140. The receiver 1140 converts the optical signal into an electric signal (a control signal) and transmits the electric signal to the drive unit 130 (the motor 136). Accordingly, as illustrated in FIG. 6, the motor 136 rotates the screw shaft 134, and as a result, the conditioning mode is established.

At this time, the connector 142 of the detection unit 140 is separated from the first switch member 110, and therefore the detection unit 140 outputs a detection signal indicating that the conditioning mode is established. The transmitter 1150 converts the detection signal output from the detection unit 140 into an optical signal and transmits the optical signal to the receiver 1160. The receiver 1160 converts the optical signal into an electric signal (a detection signal) and transmits the electric signal to the processing unit 1120. The processing unit 1120 determines that the conditioning mode is established on the basis of the detection signal. The processing unit 1120 then notifies the user that the electron gun 100 is in the conditioning mode by displaying this fact on a display unit (not shown) or the like.

After confirming that the electron gun 100 has been switched to the conditioning mode, the user operates the operation unit 1110 so as to issue an instruction to start DC conditioning. As a result, a higher voltage than the voltage applied during normal use is applied to the acceleration tube 30.

After DC conditioning has been implemented for a predetermined time, the user operates the operation unit 1110 so as to issue an instruction to terminate the DC conditioning. As a result, the voltage applied to the acceleration tube 30 is returned to the voltage applied during normal use.

Next, when the user operates the operation unit 1110 so as to issue an instruction to switch to the operation mode, the processing unit 1120 generates a control signal on the basis of the operation signal. The control signal is transmitted to the drive unit 130 (the motor 136) in a similar manner to a case in which the mode is switched to the conditioning mode, as described above. Accordingly, as illustrated in FIG. 5, the motor 136 rotates the screw shaft 134, and as a result, the operation mode is established.

At this time, the connector 142 of the detection unit 140 is in contact with the first switch member 110, and therefore the detection unit 140 outputs a detection signal indicating that the operation mode is established. Then, similarly to a case in which the mode is switched to the conditioning mode, as described above, the processing unit 1120 notifies the user that the electron gun 100 is in the operation mode by displaying this fact on the display unit (not shown) or the like.

Hence, in the electron microscope 1000, the mode can be switched without switching a high voltage ON and OFF.

The electron microscope 1000 includes the electron gun 100, in which the respective electrodes of the electron gun can be short-circuited in a state where a high voltage has been applied, and therefore DC conditioning can be executed quickly.

Note that in the above description, an example in which the electron gun 100 is incorporated into the electron microscope 1000 was described, but an electron gun according to one embodiment of the invention may be incorporated into another electron beam device (a device installed with an electron gun). As another electron beam device, a scanning electron microscope (SEM), an analysis device such as an electron probe microanalyzer (EPMA), a processing device such as an electron beam deposition device, or the like may be cited. Further, an analysis device installed with an X-ray source configured to include an electron gun and an X-ray target (for example, an X-ray photoelectron spectroscopy device (XPS)) or the like may be cited as this electron beam device.

Note that the embodiments and modification examples described above are merely examples and the invention is not limited thereto. For example, the respective embodiments and respective modification examples may be combined as appropriate.

The invention includes configurations that are substantially the same as the configurations described in the embodiments (for example, a configuration having the same function, method and result or a configuration having the same objective and effect). The invention also includes configurations in which non-essential elements described in the embodiments have been replaced by other elements. The invention further includes configurations having the same effects as those of the configurations described in the embodiments, or configurations capable of achieving the same objectives as those of the configurations described in the embodiments. Moreover, the invention includes configurations in which known techniques are added to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. An electron gun that accelerates electrons at a predetermined voltage and discharges the accelerated electrons, the electron gun comprising:
    an emitter;
    an electron gun electrode; and
    a short-circuiting mechanism for setting the emitter and the electron gun electrode at the same potential,
    wherein the short-circuiting mechanism comprises:

a first switch member provided with a first switch electrode that is connected to the emitter and a second switch electrode that is connected to the electron gun electrode;
a second switch member provided with a third switch electrode; and
a drive unit that operates at least one of the first switch member and the second switch member to switch between a state in which the first switch electrode and the second switch electrode are in contact with the third switch electrode and a state in which the first switch electrode and the second switch electrode are separated from the third switch electrode,
wherein the short-circuiting mechanism has the same potential as the predetermined voltage, and
wherein the drive unit comprises a nut, a screw shaft that is screwed to the nut, and a motor that rotates the screw shaft, and the motor rotates the screw shaft to push downward and rotate the first switch member.

2. The electron gun according to claim 1, further comprising:
a terminal plate provided with a terminal that is electrically connected to the emitter and a terminal that is electrically connected to the electron gun electrode,
the short-circuiting mechanism being located on the terminal plate.

3. An electron gun comprising:
an emitter;
an electron gun electrode;
a short-circuiting mechanism for setting the emitter and the electron gun electrode at the same potential; and
an electron gun chamber in which a terminal plate is provided, the terminal plate having a terminal that is electrically connected to the emitter and a terminal that is electrically connected to the electron gun electrode,
wherein the short-circuiting mechanism comprises:
a first switch member provided with a first switch electrode that is connected to the emitter and a second switch electrode that is connected to the electron gun electrode;
a second switch member provided with a third switch electrode; and
a drive unit that operates at least one of the first switch member and the second switch member to switch between a state in which the first switch electrode and the second switch electrode are in contact with the third switch electrode and a state in which the first switch electrode and the second switch electrode are separated from the third switch electrode,
wherein the short-circuiting mechanism is located on the terminal plate, and
wherein the drive unit comprises a nut, a screw shaft that is screwed to the nut, and a motor that rotates the screw shaft, and the motor rotates the screw shaft to push downward and rotate the first switch member.

4. The electron gun according to claim 1, wherein
the electron gun comprises a plurality of the electron gun electrodes, and
the first switch member is provided with a plurality of the second switch electrodes.

5. The electron gun according to claim 3, wherein
the electron gun comprises a plurality of the electron gun electrodes, and
the first switch member is provided with a plurality of the second switch electrodes.

6. The electron gun according to claim 1, wherein
the drive unit brings the first switch electrode and the second switch electrode into contact with the third switch electrode in response to an operation of a motor.

7. The electron gun according to claim 3, wherein
the drive unit brings the first switch electrode and the second switch electrode into contact with the third switch electrode in response to an operation of a motor.

8. The electron gun according to claim 1, wherein
the nut is inserted into a notch provided in the first switch member.

9. The electron gun according to claim 1, wherein
the nut is inserted into a notch provided in the first switch member.

10. The electron gun according to claim 1, wherein
a surface of the first switch member on which the first switch electrode and the second switch electrode are provided is a convex surface, and
a surface of the second switch member on which the third switch electrode is provided is a concave surface.

11. The electron gun according to claim 3, wherein
a surface of the first switch member on which the first switch electrode and the second switch electrode are provided is a convex surface, and
a surface of the second switch member on which the third switch electrode is provided is a concave surface.

12. The electron gun according to claim 1, further comprising:
a detection unit that detects whether or not the first switch electrode and the second switch electrode are separated from the third switch electrode, wherein
the first switch member is configured to rotate,
a mirror is provided on the first switch member, and
the detection unit comprises:
a light emitting element that emits light onto the mirror; and
a light receiving element that detects light reflected by the mirror.

13. The electron gun according to claim 3, further comprising:
a detection unit that detects whether or not the first switch electrode and the second switch electrode are separated from the third switch electrode, wherein
the first switch member is configured to rotate,
a mirror is provided on the first switch member, and
the detection unit comprises:
a light emitting element that emits light onto the mirror; and
a light receiving element that detects light reflected by the mirror.

14. An electron beam device comprising the electron gun according to claim 1.

* * * * *